United States Patent
Scheib

(10) Patent No.: US 6,822,584 B2
(45) Date of Patent: Nov. 23, 2004

(54) MORSE CODE KEY USING A STRAIN GAUGE

(75) Inventor: Robert J. Scheib, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 351 days.

(21) Appl. No.: 09/859,874

(22) Filed: May 17, 2001

(65) Prior Publication Data

US 2002/0171565 A1 Nov. 21, 2002

(51) Int. Cl.[7] .................................................. H03M 7/00
(52) U.S. Cl. .............................. 341/22; 341/20; 341/34; 178/110; 200/211
(58) Field of Search ............................. 341/20, 22, 34; 178/110; 200/211

(56) References Cited

U.S. PATENT DOCUMENTS

| | | | | |
|---|---|---|---|---|
| 3,579,186 A | * | 5/1971 | Johnson et al. ............ 382/121 |
| 4,204,197 A | | 5/1980 | Loshbough et al. ........ 340/347 |
| 4,307,371 A | * | 12/1981 | Ort ................................ 338/2 |
| 5,224,384 A | * | 7/1993 | Kremidas et al. ............. 73/721 |
| 5,319,980 A | * | 6/1994 | Kremidas ..................... 73/721 |
| 5,510,784 A | * | 4/1996 | Polaert et al. ................ 341/34 |
| 5,579,283 A | | 11/1996 | Owens ......................... 367/83 |
| 5,675,329 A | * | 10/1997 | Barker et al. ................. 341/22 |
| 5,995,026 A | * | 11/1999 | Sellers ......................... 341/34 |
| 6,122,974 A | * | 9/2000 | Sato et al. .................... 73/754 |
| 6,318,185 B1 | * | 11/2001 | Aumard et al. ............... 73/818 |
| 6,331,849 B1 | * | 12/2001 | VandenBoom .............. 345/161 |
| 6,509,847 B1 | * | 1/2003 | Anderson ..................... 341/34 |
| 6,536,536 B1 | * | 3/2003 | Gass et al. ..................... 173/2 |
| 6,672,170 B1 | * | 1/2004 | DiPaola ....................... 73/717 |

* cited by examiner

*Primary Examiner*—Albert K. Wong

(57) ABSTRACT

The inventive code key comprises a bendable element and a strain gauge connected to the bendable element. The strain gauge changes resistance when the bendable element is moved.

3 Claims, 3 Drawing Sheets

MORSE CODE KEY USING A STRAIN GAUGE

BACKGROUND

Typical prior art morse code keys usually involve a lever arm and a contact point, wherein the lever arm is moved into contact with the contact point. When the lever arm touches the contact point, an electrical circuit is completed, which causes a signal to be generated. When the level arm is moved away from touching the contact point, a circuit is opened, and the signal generation is stopped. The signal may be sent across a wire to a receiver, i.e. telegraph. Alternatively, the signal may be broadcasted into the atmosphere via an antenna.

The motion of the morse code key may be vertical or up-and-down. In other words, the lever arm is moved down to make contact and is moved up to break or open contact. The motion of the code key may also be side-to-side. This is where the lever arm is moved to one side direction to make contact and is moved in the other side direction to break or open contact. Prior art code keys typically use a spring, or the elastic properties of the level arm to maintain the code key in the open position, such that force must be applied to the lever arm to make contact with the contact point.

Prior art code keys have several problems. One problem is that the contact point and the lever arm can become worn and/or dirty. This causes poor electrical contact between the contact point and the lever arm, which in turn causes a poor signal. The poor signal could be an interrupted signal such that a receiver could erroneously interpret the signal to be two signals, which would garble the message. The poor signal could also be a scratchy or otherwise degraded signal that is poorly received. Another problem is that prior art code keys are mechanically complex. The code keys typically contain multiple moving parts and include a pivot point, which is typically a ball or needle bearing. These types of bearings add to the complexity and expense of manufacturing. A further problem is the acoustic noise that is produced through the use of the code key. The code key clicks or taps each time that contact is made between the lever arm and the contact point. In covert operations, such clicking or tapping can reveal the user's location. In home or office use or use during traveling, such clicking or tapping can disturb other family members or other individuals.

SUMMARY OF THE INVENTION

The present invention is directed to a system and method in which a code key that comprises a bendable element and a strain gauge connected to the bendable element. The strain gauge changes resistance when the bendable element is moved.

The inventive code key may be operated by providing a flexible element and a strain gauge connected to the flexible element. In moving the flexible element, the resistance of the strain gauge is changed.

DETAILED DESCRIPTION

The present invention preferably comprises a strain gauge mounted on a bendable element to turn a preferred embodiment of the invention code key. As the bendable element is moved, the resistance of the strain gauge is changed. A detection circuit preferably detects the change in resistance and forms a signal. The amount of movement of the bendable element required for detection is dependent on the sensitivity of the detection circuit. The inventive code key is preferably used to send morse code information, but can be used to form any other information, including but not limited to, a switch that sends on/off information.

Since no contact has to be made between two different elements, but rather only slight movement of one element, there are no contacts to become worn or dirty. Moreover, the slight movement also allows the inventive code key to be relatively quiet during operation, as compared to the noise of operation of prior code keys. Furthermore, the inventive code key does not contain multiple moving elements and does not contain a pivot point, and thus is less expensive to build than prior code keys. Also, the inventive code key can be sealed, such that the inventive code key can be operated in dirty and/or wet environments.

The bendable element may be comprised of metal, plastic, rubber, fiber, cellulose, any other flexible material that can be bonded with a strain gauge, or combinations of these materials. Note that if a less flexible or bendable element is selected, then a more sensitive detector is required. Thus, for a relatively stiff bendable element, the detection circuits needs to be more sensitive than for a relatively elastic bendable element. The flexiblity of the bendable element can be selected via the material and/or thickness of the bendable element.

The detection circuit may comprise a comparator, a bridge, a wheatstone bridge, an ohm meter, or any other circuit that can detect a change in resistance of the strain gauge.

Figure 1:
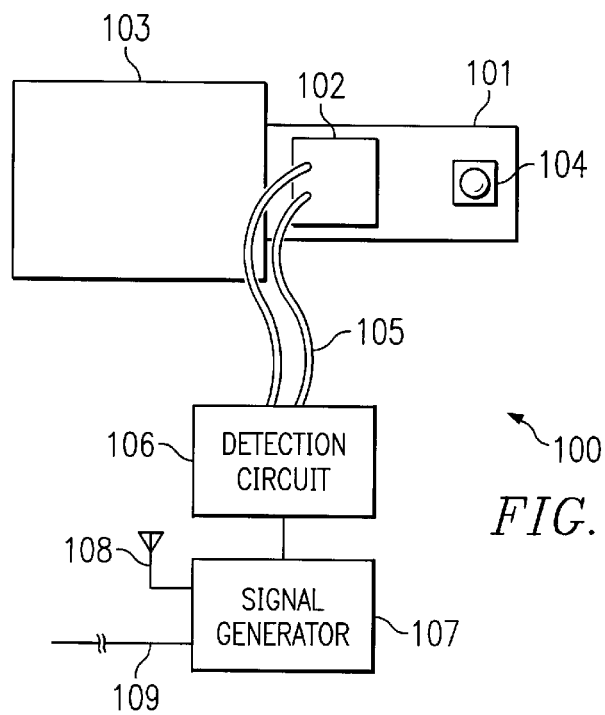
FIG. 1 depicts a preferred embodiment of the inventive code key.

FIG. 1 depicts a preferred embodiment of inventive code key 100. Code key 100 comprises bendable element 101, which is connected to block 103. Note that what is meant by "block" is any object that is fixed relative to bendable element 101. This would allow a portion of the bendable element to be moved, which would then cause the bendable element to flex and incur strain. Note that the block itself may be moveable. Block 103 can be a vise, a clamp, a holder, a support, and/or a portion of a device. Thus, the combination of block 103 and bendable element 101 form a lever arm.

Strain gauge 102 is attached to bendable element 101. Attachment may be accomplished through a variety of manners, e.g. glue, welding, bonding, and deposition. Note that some strain gauges comprise multiple elements with each element having a different axis of orientation. This allows for detection of strain along each axis of orientation and/or vector analysis of the force being applied to the strain gauge. Only one element is required, but more could be used if needed by detection circuit 106.

The inventive code key may also comprise user interface 104, which allows a user to move bendable element 101. The user interface may include a knob, a touch pad, a button, a stick, and a touch portion of the bendable element. Strain gauge 102 is connected to detection circuit 106, via wire or wires 105. Detection circuit detects a change in the resistance of the strain gauge and forms a resistance signal that includes information describing the change in the resistance. The resistance signal is then provided to signal generator 107 which forms an output signal from the resistance signal and is suitable for transmission to a receiver over one or more of antenna 108, land line 109, and light link (not shown).

Figure 2A:
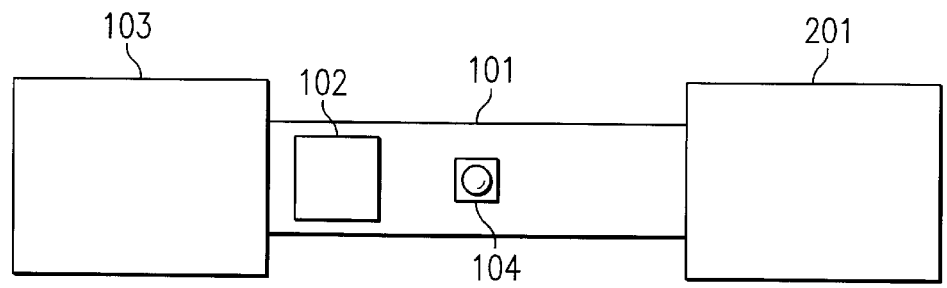
FIGS. 2A–2C depicts alternative embodiments for the inventive code shown in FIG. 1.
Figure 2B:
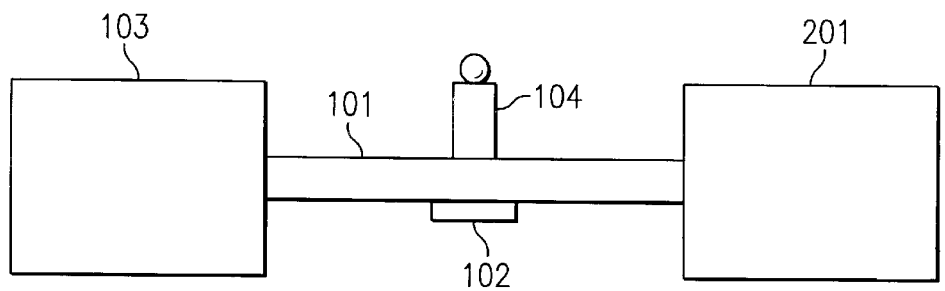
Figure 2C:
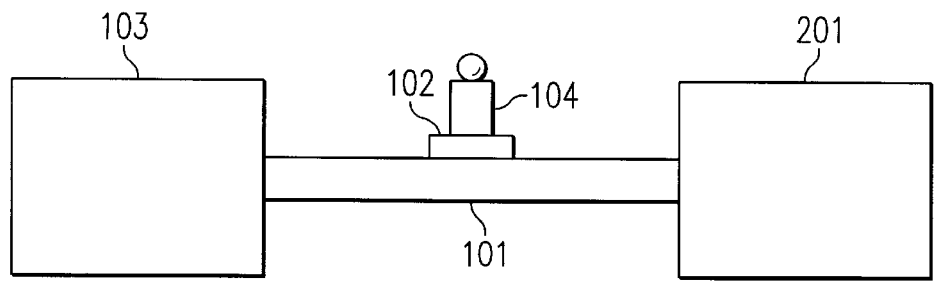

FIGS. 2A–2C depict alternative embodiments for the inventive code key of FIG. 1. In FIG. 2A, the inventive code key includes second block 201. Thus, bendable element 101 is supported on both ends, i.e. by block 103 and block 201. Rather than forming a lever arm, this arrangement forms a "button", wherein the center portion of bendable element 101 is moveable to produce strain. In FIG. 2B, the location of the strain gauge is underneath bendable element 101 and below interface 104. In FIG. 2C, the location of the strain gauge is underneath interface 104 and on top of bendable element 101.

Figure 3A:
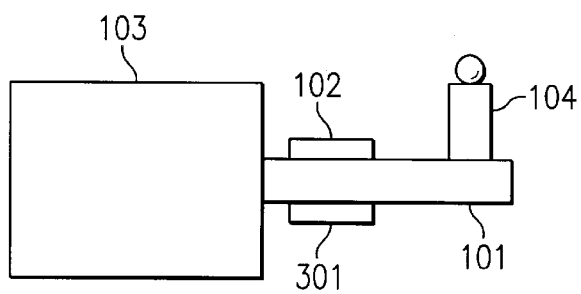
FIGS. 3A and 3B depict alternative embodiments for the inventive code key shown in FIG. 1 using multiple strain gauges.
Figure 3B:
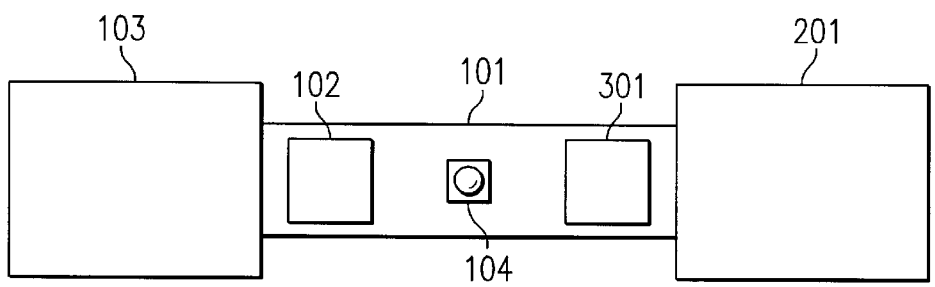

FIGS. 3A and 3B depict alternative embodiments for the inventive code key of FIG. 1 using multiple strain gauges. In FIG. 3A the arrangement of FIG. 1 is shown to include second strain gauge 301. Note that this arrangement is shown using a single block, but may also be used with two blocks. The second strain gauge can be connected to the detection circuit to provide a second resistance signal and thereby improves detection by the detection circuit. Also, two strain gauges 102, 301 may be connected in series which effectively doubles the resistance signal and thereby improves detection by the detection circuit. FIG. 3B depicts the arrangement of FIG. 2A with second strain gauge 301. Note that additional strain gauge(s) may be located underneath bendable element 101.

Figure 4:
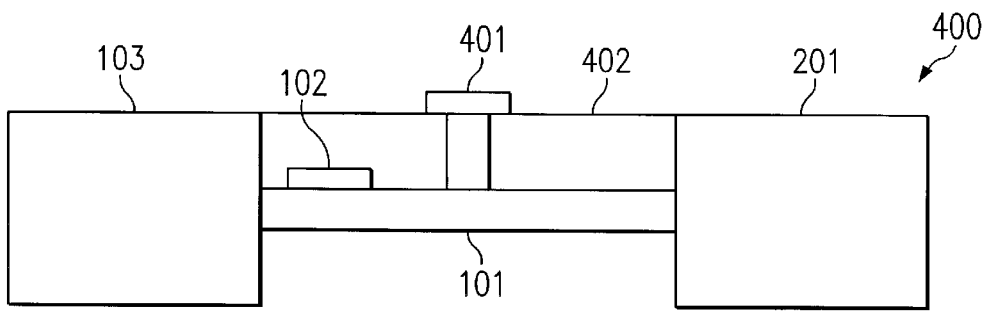
FIG. 4 depicts an alternative embodiment for the inventive code key wherein the code key includes the seal.

FIG. 4 depicts an alternative embodiment of the inventive code key, wherein code key 400 includes seal 402. Seal 402 may be a hermetic and/or moisture seal which would keep out dirt and/or moisture. It shall be appreciated that seal 402 need not cover the entire surface area defined between block 103 and second block 201. Instead, seal 402 may be implemented to only cover wire connections of the strain gauge, if desired. User interface 401 is located above the seal, and transmits movement to bendable element 101. The user interface may comprise an element(s) similar to interface 104. This arrangement may be located on a handheld unit for field use.

Note that additional arrangements can be formed by combining different aspects of FIGS. 1–4. For example, by combining FIGS. 2B and 2C, a multiple strain gauge arrangement can be formed that has the strain gauges located on both sides of the bendable element and the interface located on top of one of the strain gauges.

Also note that the orientations of the inventive code key shown in the FIGURES is by way of example only, as the code keys of the FIGURES may be rotated in any orientation. For example, the inventive code key may be rotated such that the movement produces strain is side-to-side.

Figure 5A:
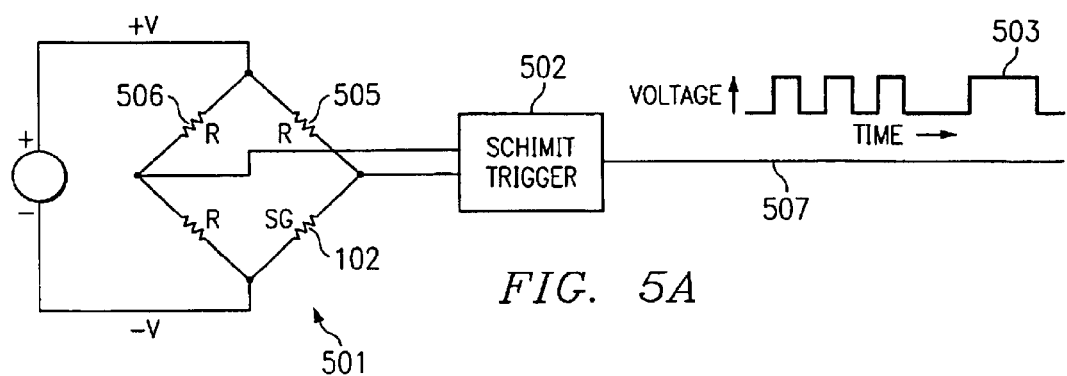
FIG. 5A depicts a wheatstone bridge that is an example of a detection circuit for the code keys shown in FIGS. 1, 2A–2C, and 4.
Figure 5B:
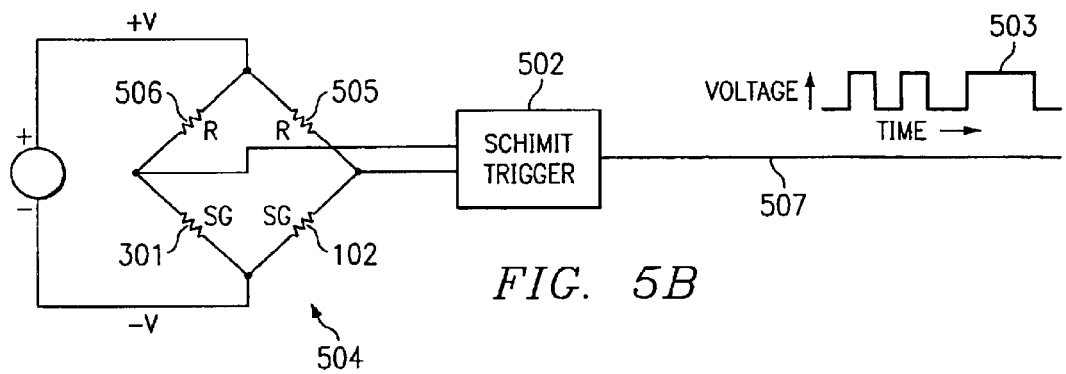
FIG. 5B depicts a wheatstone bridge that is an example of a detection circuit for the code keys shown in FIGS. 3A and 3B.

FIGS. 5A and 5B depict examples of detection circuit 106 and signal generator circuit 107 of FIG. 1. Note that these are examples only, as other circuits could be used for detection and signal generation.

FIG. 5A depicts wheatstone bridge 501 that is an example of a detection circuit for the code keys shown in FIGS. 1, 2A–2C, and 4 which depict the single strain gauge embodiments of the inventive code key. Strain gauge 102 connects as a resistor in bridge 501. The R values of the other resistors of the bridge are selected to be an equilibrum value of the strain gauge (i.e. the resistance of the strain gauge at rest or without the user moving the bendable element). Thus, any change of the resistance of the strain gauge, via movement of the bendable element would result in a differential voltage being supplied to Schmitt trigger 502. Note that one of the other resistors, either 505 or 506, can be replaced with a variable resistor which would allow for variation in the manufacturing tolerances of the strain gauge. The variable resistor would be set so that output points of the bridge has zero differential voltage when the strain gauge is at equilibrium.

The output points are then connected to the signal generator, which is exemplarily shown in this FIGURE as Schmitt trigger 502. When the voltage differential of the output points reaches a predetermined level, trigger 502 would then generate output signal 503 on line 507. The output signal would be maintained in a high state until the voltage differential falls below the predetermined level, after which the output signal is in the low state. This allows long and short pulse to be generated for morse code. In other words, as long as the code key is depressed, the output signal will be high, and when the key is not depressed, the output signal will be low or off.

FIG. 5B depicts wheatstone bridge 504 that is an example of a detection circuit for the code keys shown in FIGS. 3A and 3B which depict multiple strain gauge embodiments of the inventive code key. Bridge 504 has strain gauges 102 and 301 connected as resistors in the bridge. The other elements of this FIGURE are similar to those of FIG. 5A.

Note that the Schmitt trigger of FIGS. 5A and 5B may be replaced with a comparator or amplifier.

What is claimed is:

1. A method for operating a code key comprising:

providing a flexible element; and providing a first strain gauge connected to a first surface of the flexible element, and a second strain gauge connected to a second surface that is opposite the first surface; and moving the flexible element and thereby changing the resistance of at least one of the strain gauges.

2. The method of claim 1 further comprising:

detecting a change in resistance in at least one of the strain gauges; and forming a signal.

3. The method of claim 2, further comprising:

forming an output signal from the signal;

providing the output signal to one of an antenna, a land line, and a light link, wherein the output signal includes data representative of movement of the bendable element.

* * * * *